(12) United States Patent
Yamada et al.

(10) Patent No.: US 12,142,501 B2
(45) Date of Patent: Nov. 12, 2024

(54) SUBSTRATE PROCESSING SYSTEM AND TEMPERATURE CONTROL METHOD

(71) Applicant: TOKYO ELECTRON LIMITED, Tokyo (JP)

(72) Inventors: Kenichiro Yamada, Miyagi (JP); Satoru Teruuchi, Miyagi (JP); Kenichiro Nakamura, Miyagi (JP); Takari Yamamoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 539 days.

(21) Appl. No.: 17/484,914

(22) Filed: Sep. 24, 2021

(65) Prior Publication Data
US 2022/0013387 A1 Jan. 13, 2022

Related U.S. Application Data

(62) Division of application No. 15/630,549, filed on Jun. 22, 2017, now abandoned.

(30) Foreign Application Priority Data

Jun. 24, 2016 (JP) .................................. 2016-125791

(51) Int. Cl.
*H01L 21/67* (2006.01)
*C23C 16/46* (2006.01)
(Continued)

(52) U.S. Cl.
CPC ........ *H01L 21/67248* (2013.01); *C23C 16/46* (2013.01); *C23C 16/463* (2013.01);
(Continued)

(58) Field of Classification Search
CPC ....... C23C 16/46; C23C 16/463; C23C 16/50; C23C 16/5096; C23C 16/52;
(Continued)

(56) References Cited

U.S. PATENT DOCUMENTS

2008/0309239 A1 12/2008 Kasal et al.
2010/0000970 A1 1/2010 Koshimizu et al.
(Continued)

FOREIGN PATENT DOCUMENTS

CN 101625952 A 1/2010
JP 2000-339039 A 12/2000
(Continued)

*Primary Examiner* — Vy T Nguyen
(74) *Attorney, Agent, or Firm* — XSENSUS LLP

(57) ABSTRACT

A substrate processing system includes a substrate processing apparatus and a control device. The substrate processing apparatus includes a chamber, and a placing table provided inside the chamber. The placing table places a substrate thereon, and includes a base and an electrostatic chuck provided on an upper surface of the base. The electrostatic chuck has a plurality of division regions each provided with a heater therein. The substrate processing system also includes a control device that includes a measuring unit that measures a resistance value of the heater for each of the division regions, an estimating unit that estimates a temperature of each of the division regions based on the resistance value of the heater measured by the measuring (Continued)

unit, and a power controller that controls a power supplied to the heater for each of the division regions based on the temperature estimated by the estimating unit.

9 Claims, 12 Drawing Sheets

(51) Int. Cl.
| | |
|---|---|
| C23C 16/50 | (2006.01) |
| C23C 16/509 | (2006.01) |
| C23C 16/52 | (2006.01) |
| H01J 37/32 | (2006.01) |
| H01L 21/683 | (2006.01) |
| H05B 1/02 | (2006.01) |

(52) U.S. Cl.
CPC .......... *C23C 16/50* (2013.01); *C23C 16/5096* (2013.01); *C23C 16/52* (2013.01); *H01J 37/32009* (2013.01); *H01J 37/32724* (2013.01); *H01L 21/67103* (2013.01); *H01L 21/67109* (2013.01); *H01L 21/6831* (2013.01); *H05B 1/0233* (2013.01); *H01J 2237/334* (2013.01)

(58) Field of Classification Search
CPC .......... H01J 2237/334; H01J 37/32009; H01J 37/32724; H01L 21/67103; H01L 21/67248; H01L 21/6831; H05B 1/0233
USPC .......... 219/536; 118/724, 725, 620; 392/416, 392/418
See application file for complete search history.

(56) References Cited

U.S. PATENT DOCUMENTS

| | | |
|---|---|---|
| 2012/0076477 A1 | 3/2012 | Kuroiwa |
| 2012/0275484 A1 | 11/2012 | Hayashi et al. |
| 2012/0292305 A1* | 11/2012 | Ambal .................. G05D 23/22 219/520 |
| 2015/0055940 A1* | 2/2015 | Steinhauser ...... H01L 21/67109 219/490 |

FOREIGN PATENT DOCUMENTS

| | | |
|---|---|---|
| JP | 2006-283173 A | 10/2006 |
| JP | 2009-541740 A | 11/2009 |
| JP | 2015-220413 A | 12/2015 |
| KR | 10-0757694 B1 | 9/2007 |
| WO | 2007/149205 A2 | 12/2007 |

* cited by examiner

FIG. 7

| TEMPERATURE (°C) | RESISTANCE VALUE (Ω) |
|---|---|
| 20 | 43.5 |
| 30 | 43.9 |
| 40 | 44.3 |
| ⋮ | ⋮ |

SUBSTRATE PROCESSING SYSTEM AND TEMPERATURE CONTROL METHOD

CROSS-REFERENCE TO RELATED APPLICATIONS

This application is a Divisional of U.S. patent application Ser. No. 15/630,549, filed on Jun. 22, 2017, which claims priority from Japanese Patent Application No. 2016-125791, filed on Jun. 24, 2016, with the Japan Patent Office, all of which are incorporated herein in their entireties by reference.

TECHNICAL FIELD

Various aspects and exemplary embodiments of the present disclosure relate to a substrate processing system and a temperature control method.

BACKGROUND

In a semiconductor manufacturing process, the temperature of a semiconductor wafer as a processing target substrate is one of important factors that determine the characteristics of a semiconductor. Thus, in the manufacturing process, it is required to control the temperature of the semiconductor wafer with high accuracy. In order to implement this, for example, it may be considered that a placing table on which the semiconductor wafer is to be placed is divided into a plurality of regions, and independently controllable heaters are provided in the respective divided regions.

However, even when the independently controllable heaters are provided in the respective divided regions on the placing table, it is difficult to determine whether the temperature of each of the regions is controlled to a desired temperature. Thus, it may be considered that a temperature sensor is provided in each region in addition to the heater. Accordingly, it becomes possible to control the temperature of each region on the placing table with high accuracy. See, e.g., Japanese Patent Laid-Open Publication No. 2006-283173.

SUMMARY

In an aspect of the present disclosure, the substrate processing system includes, a substrate processing apparatus and a control device that controls the substrate processing apparatus. The substrate processing apparatus includes a chamber, a placing table provided within the chamber, on which a processing target substrate is placed, and heaters embedded in the placing table corresponding to division regions, respectively, that is, a plurality of divided regions of the top surface of the placing table. The control device includes: a holding unit that holds a table for each of the division regions, the table indicating a relationship between a resistance value of each of the heaters embedded in the placing table and a temperature of each of the division regions; a measuring unit that measures the resistance value of each of the heaters embedded in the placing table for each of the division regions; and a controller that estimates a temperature of each of the division regions corresponding to the resistance value of each of the heaters measured by the measuring unit with reference to the table for each of the division regions, and controls an electric power to be supplied to each of the heaters so that the estimated temperature becomes a target temperature.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7 is a view illustrating an example of a conversion table.

DETAILED DESCRIPTION

Figure 1:
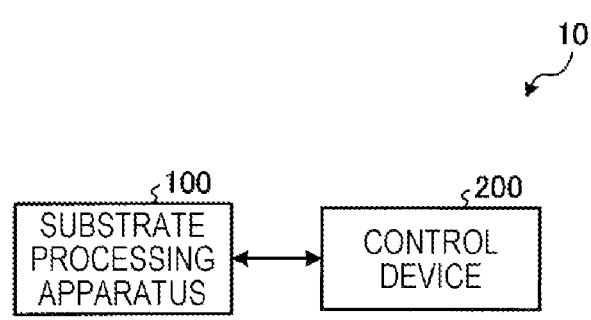
FIG. 1 is a system configuration view illustrating an example of a substrate processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The demand for accuracy in the temperature control of the semiconductor wafer is increasing day by day according to the miniaturization of a process. Thus, it becomes necessary to control the temperature of the semiconductor wafer in each smaller region, and thus the number of divided regions on the placing table is increased. When the number of divided regions on the placing table is increased, the number of heaters and the number of temperature sensors provided in the placing table are increased. This makes it difficult to miniaturize the placing table. When the number of heaters and the number of temperature sensors provided in the placing table are increased, the structure of the placing table becomes complicated, and the degree of freedom in design is decreased.

The disclosed substrate processing system, according to an aspect, includes, a substrate processing apparatus and a control device that controls the substrate processing apparatus. The substrate processing apparatus includes a chamber, a placing table provided within the chamber, on which a processing target substrate is placed, and heaters embedded in the placing table corresponding to division regions, respectively, that is, a plurality of divided regions of the top surface of the placing table. The control device includes: a holding unit that holds a table for each of the division regions, the table indicating a relationship between a resistance value of each of the heaters embedded in the placing table and a temperature of each of the division regions; a measuring unit that measures the resistance value of each of the heaters embedded in the placing table for each of the division regions; and a controller that estimates a temperature of each of the division regions corresponding to the resistance value of each of the heaters measured by the measuring unit with reference to the table for each of the division regions, and controls an electric power to be supplied to each of the heaters so that the estimated temperature becomes a target temperature.

In the disclosed substrate processing system, according to an aspect, an AC voltage and an AC current are supplied to each of the heaters, and the measuring unit may measure the resistance value of each of the heaters based on instantaneous values of the AC voltage and the AC current at an intermediate timing between adjacent zero-cross points at which the instantaneous value of the AC voltage supplied to each of the heaters becomes 0 V.

In the disclosed substrate processing system, according to an aspect, a temperature sensor may be provided in the placing table corresponding to at least one of the division regions. When a difference equal to or larger than a predetermined value occurs between a temperature of the division region measured by the temperature sensor and a temperature estimated based on a resistance value of the heater provided in the division region, the controller may correct temperatures estimated for all division regions based on the difference.

The disclosed temperature control method, according to an aspect, controls the temperature of a surface of a placing table on a substrate processing apparatus. The substrate processing apparatus includes: a chamber, a placing table provided within the chamber, on which a processing target substrate is placed, and heaters embedded in the placing table corresponding to division regions, respectively, that is, a plurality of divided regions of the top surface of the placing table. In the temperature control method, the control device executes: measuring the resistance value of each of the heaters embedded in the placing table for each of the division regions; estimating a temperature of each of the division regions corresponding to the resistance value of each of the heaters measured with reference to the table for each of the division regions, the table indicating a relationship between a resistance value of each of the heaters embedded in the placing table and a temperature of each of the division regions; and controlling an electric power to be supplied to each of the heaters so that the estimated temperature becomes a target temperature.

In the disclosed temperature control method, according to an aspect, an AC voltage and an AC current are supplied to each of the heaters. In the measuring of the resistance value, the resistance value of each of the heaters may be measured based on instantaneous values of the AC voltage and the AC current at an intermediate timing between adjacent zero-cross points at which the instantaneous value of the AC voltage supplied to each of the heaters becomes 0 V.

In the disclosed temperature control method, according to an aspect, a temperature sensor may be provided in the placing table corresponding to at least one of the division regions. In the controlling of the electric power, when a difference equal to or larger than a predetermined value occurs between a temperature of the division region measured by the temperature sensor and a temperature estimated based on a resistance value of the heater provided in the division region, temperatures estimated for all division regions may be corrected based on the difference.

In the disclosed temperature control method, according to an aspect, the control device may further execute creating the table. The creating of the table may include: controlling an electric power to be supplied to the heater provided in the division region for each setting temperature based on a temperature measured by the temperature sensor so that the temperature of the division region provided with the temperature sensor becomes the setting temperature; measuring a radiation amount of light with a predetermined wavelength emitted from each of the division regions, for each setting temperature, using a camera; controlling an electric power to be supplied to each of the heaters provided in each of the division regions so that a difference between the radiation amount of light with a predetermined wavelength emitted from other division regions not provided with the temperature sensor, and the radiation amount of light with a predetermined wavelength emitted from the division region provided with the temperature sensor falls within a predetermined value, for each setting temperature; measuring a resistance value of each of the heaters provided in each of the division regions, for each setting temperature; and creating a table in which the setting temperature is associated with the resistance value of each of the heaters provided in each of the division regions.

According to various aspects and exemplary embodiments of the present disclosure, the placing table may be miniaturized and the structure thereof may be simplified.

Hereinafter, exemplary embodiments of the disclosed substrate processing system and temperature control method will be described in detail with reference to drawings. The present disclosure is not limited by the following exemplary embodiments. Respective exemplary embodiments may be properly combined within a range that does not make the processing contents thereof inconsistent with each other.

First Exemplary Embodiment

[System Configuration of Substrate Processing System 10]

FIG. 1 is a system configuration view illustrating an example of a substrate processing system 10. As illustrated in FIG. 1, for example, the substrate processing system 10 includes a substrate processing apparatus 100 and a control device 200. The substrate processing apparatus 100 performs a processing such as, for example, plasma etching, plasma chemical vapor deposition (CVD), or heat treatment on a semiconductor wafer W as an example of a target substrate. The control device 200 controls each unit of the substrate processing apparatus 100, and causes the substrate processing apparatus 100 to execute a predetermined processing on the semiconductor wafer W carried into the substrate processing apparatus 100.

[Configuration of Substrate Processing Apparatus 100]

Figure 2:
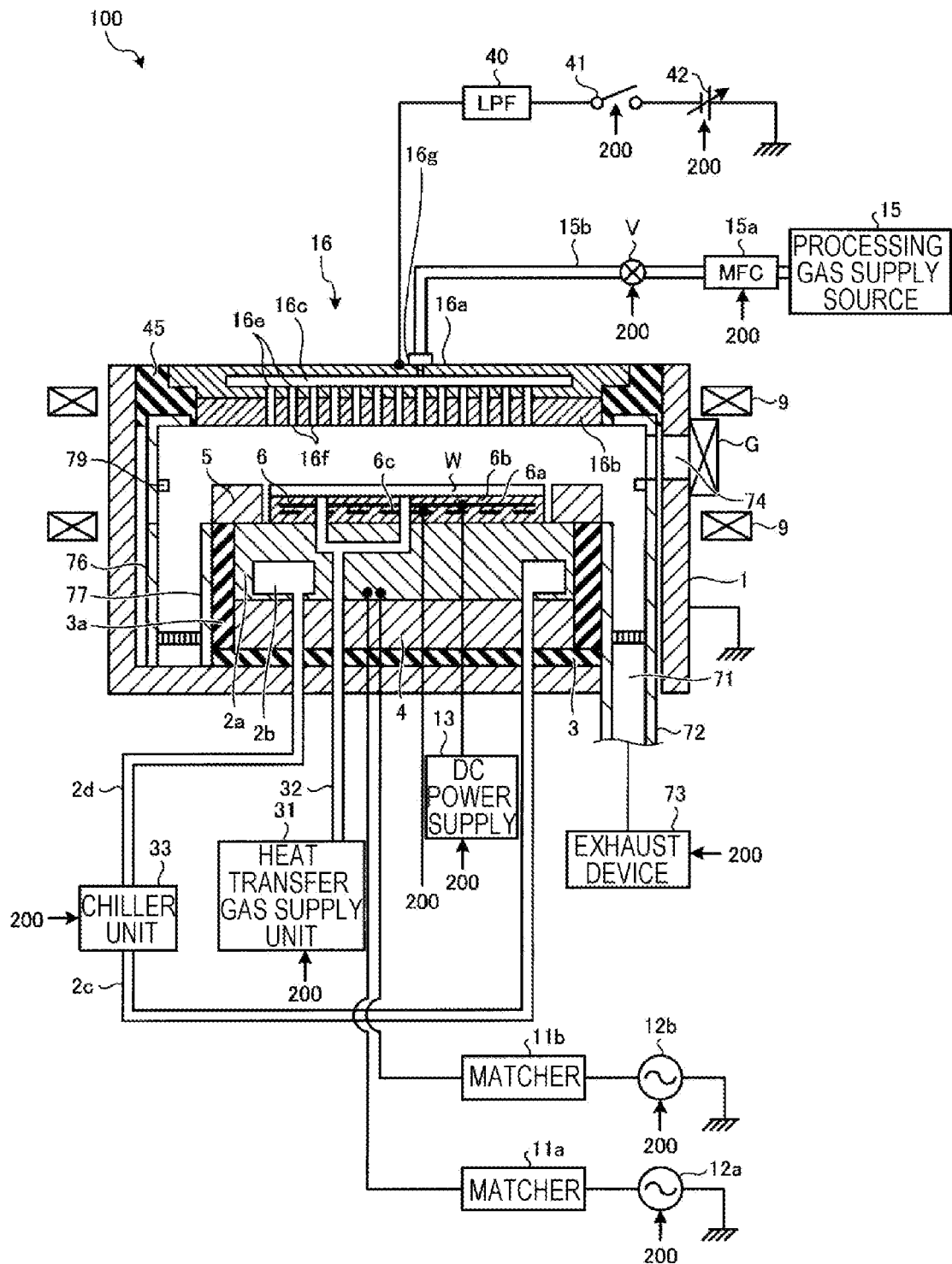
FIG. 2 is a sectional view illustrating an example of a configuration of a substrate processing apparatus according to a first exemplary embodiment.

FIG. 2 is a sectional view illustrating an example of a configuration of the substrate processing apparatus 100 according to the first exemplary embodiment. In the present exemplary embodiment, as illustrated in FIG. 2, the substrate processing apparatus 100 includes, for example, a chamber 1 that is hermetically configured and electrically grounded. The chamber 1 is formed in a substantially cylindrical shape by, for example, aluminium having a surface covered with an anodic oxide film.

A base unit 2a made of a conductive metal such as, for example, aluminum, is provided within the chamber 1. The base unit 2a serves as a lower electrode. The base unit 2a is supported by a conductor support base 4 provided on an insulating plate 3. A focus ring 5 made of, for example, a single crystal silicon is provided at the upper outer periphery of the base unit 2a. Around the base unit 2a and the support base 4, a cylindrical inner wall member 3a made of, for example, quartz, is further provided to surround the base unit 2a and the support base 4.

A shower head 16 serving as an upper electrode is provided above the base unit 2a to face the base unit 2a substantially in parallel, that is, to face the semiconductor wafer W placed on the base unit 2a. The shower head 16 and the base unit 2a serve as a pair of electrodes (an upper electrode and a lower electrode). A high-frequency power supply 12a is connected to the base unit 2a through a matcher 11a. A high-frequency power supply 12b is connected to the base unit 2a through a matcher 11b.

The high-frequency power supply 12a supplies a high frequency power at a predetermined frequency (e.g., 100 MHz) used for plasma generation to the base unit 2a. The high-frequency power supply 12b supplies a high frequency power at a predetermined frequency used for ion attraction (bias), that is, a frequency (e.g., 13 MHz) lower than that of the high-frequency power supply 12a, to the base unit 2a. For example, the power ON/OFF of the high-frequency power supplies 12a and 12b, and the high-frequency power supplied by the high-frequency power supplies 12a and 12b are controlled by the control device 200 to be described below.

An electrostatic chuck 6 is provided on the top surface of the base unit 2a to attract and hold the semiconductor wafer W, and to heat the semiconductor wafer W. The electrostatic chuck 6 includes insulators 6b, an electrode 6a provided between the insulators 6b, and a plurality of heaters 6c. The electrode 6a is connected to a DC power supply 13. The heaters 6c are connected to the control device 200 to be described below. The electrostatic chuck 6 generates a Coulomb force on the surface of the electrostatic chuck 6 by a DC voltage applied from the DC power supply 13, and attracts and holds the semiconductor wafer W on the top surface of the electrostatic chuck 6 by the Coulomb force. The power ON/OFF of the DC power supply 13 is controlled by the control device 200 to be described below.

The electrostatic chuck 6 heats the semiconductor wafer W by the heaters 6c heated by the electric power supplied from the control device 200. The top surface of the electrostatic chuck 6 is divided into a plurality of division regions, and one heater 6c is provided in each of the division regions. The base unit 2a and the electrostatic chuck 6 are examples of a placing table.

A flow path 2b is formed within the base unit 2a, through which a refrigerant such as, for example, galden, flows, and a chiller unit 33 is connected to the flow path 2b through pipes 2c and 2d. While the refrigerant supplied from the chiller unit 33 circulates through the inside of the flow path 2b, the base unit 2a is cooled through heat exchange with the refrigerant. For example, the temperature and the flow rate of the refrigerant supplied by the chiller unit 33 are controlled by the control device 200 to be described below.

In the base unit 2a, a pipe 32 is provided through the base unit 2a so as to supply a heat transfer gas (a backside gas) such as, for example, a helium gas, to the rear surface side of the semiconductor wafer W. The pipe 32 is connected to a heat transfer gas supply unit 31. For example, the flow rate of the heat transfer gas supplied to the rear surface side of the semiconductor wafer W from the heat transfer gas supply unit 31 through the pipe 32 is controlled by the control device 200 to be described below.

The control device 200 controls the temperature of the refrigerant flowing through the flow path 2b, the electric power supplied to each of the heaters 6c within the electrostatic chuck 6, and the flow rate of the heat transfer gas supplied to the rear surface of the semiconductor wafer W, thereby controlling the temperature of the semiconductor wafer W attracted and held on the top surface of the electrostatic chuck 6 to a temperature within a predetermined range.

The shower head 16 is provided at the top portion of the chamber 1. The shower head 16 includes a body portion 16a, and an upper top plate 16b constituting an electrode plate, and supported at the top portion of the chamber 1 through an insulating member 45. The body portion 16a is made of, for example, aluminum with a surface that has been subjected to anodic oxidation treatment, and detachably supports the upper top plate 16b at the bottom portion thereof. The upper top plate 16b is made of, for example, a silicon-containing material, e.g., quartz.

A gas diffusion chamber 16c is provided within the body portion 16a. A plurality of gas outlets 16e are formed at the bottom portion of the body portion 16a so as to be located under the gas diffusion chamber 16c. A plurality of gas introducing holes 16f are provided in the upper top plate 16b to extend through the upper top plate 16b in the thickness direction, and the gas introducing holes 16f communicate with the above described gas outlets 16e, respectively. Through this configuration, a processing gas supplied to the gas diffusion chamber 16c is supplied into the chamber 1 through each of the gas outlets 16e and the gas introducing holes 16f to be diffused in a shower form. A temperature regulator such as, for example, a pipe (not illustrated) configured to circulate a refrigerant or a heater (not illustrated) is provided in, for example, the body portion 16a, and is configured to control the shower head 16 to a temperature within a desired range during the processing of the semiconductor wafer W.

A gas introducing port 16g is formed in the body portion 16a to introduce the processing gas to the gas diffusion chamber 16c. The gas introducing port 16g is connected to one end of a pipe 15b, and a processing gas supply source 15 that supplies the processing gas used for the processing of the semiconductor wafer W is connected to the other end of the pipe 15b via a valve V and a mass flow controller (MFC) 15a. The processing gas supplied from the processing gas supply source 15 is supplied to the gas diffusion chamber 16c through the pipe 15b, and supplied into the chamber 1 through each of the gas outlets 16e and the gas introducing holes 16f to be diffused in a shower form. The valve V and the MFC 15a are controlled by the control device 200 to be described below.

A variable DC power supply 42 is electrically connected to the shower head 16 through a low pass filter (LPF) 40 and a switch 41. The variable DC power supply 42 is capable of supplying or cutting off a DC voltage by the switch 41. The current and the voltage of the variable DC power supply 42 and the turning on/off of the switch 41 are controlled by the control device 200 to be described below. For example, when a high frequency power is supplied from the high-frequency power supplies 12a and 12b to the base unit 2a and plasma is generated in a processing space within the chamber 1, the switch 41 is turned ON by the control device 200 as necessary, and a DC voltage at a predetermined magnitude is applied to the shower head 16 serving as an upper electrode.

An exhaust port 71 is formed at the bottom portion of the chamber 1. An exhaust device 73 is connected to the exhaust port 71 through an exhaust pipe 72. The exhaust device 73 includes a vacuum pump, and is configured to decompress the inside of the chamber 1 to a predetermined vacuum degree by operating the vacuum pump. For example, the exhaust flow rate of the exhaust device 73 is controlled by the control device 200 to be described below. An opening 74 is formed in the side wall of the chamber 1, and a gate valve G for opening and closing the opening 74 is provided in the opening 74.

A deposition shield 76 is detachably provided along an inner wall surface, on the inner wall of the chamber 1. A deposition shield 77 is provided on an outer peripheral surface of the inner wall member 3a to cover the inner wall member 3a. The deposition shields 76 and 77 prevent etching by-product (deposition) from being attached to the inner wall of the chamber 1. A conductive member (GND block) 79 connected to a ground in a DC manner is provided at a position of the deposition shield 76 having substantially the same height as the semiconductor wafer W attracted and held on the electrostatic chuck 6. An abnormal discharge in the chamber 1 is suppressed by the conductive member 79.

A ring magnet 9 is concentrically disposed around the chamber 1. The ring magnet 9 forms a magnetic field in a space between the shower head 16 and the base unit 2a. The ring magnet 9 is rotatably held by a rotation mechanism (not illustrated).

[Electrostatic Chuck 6]

Figure 3:
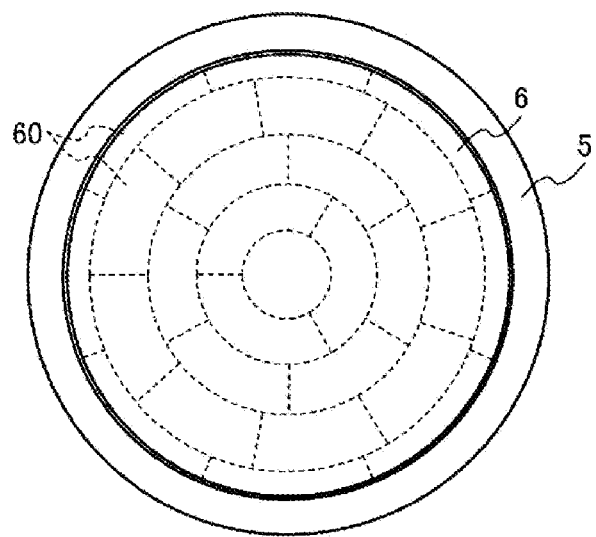
FIG. 3 is a view illustrating an example of a top surface of an electrostatic chuck.

FIG. 3 is a view illustrating an example of the top surface of the electrostatic chuck 6. The focus ring 5 is provided at the outer periphery of the electrostatic chuck 6 to surround the electrostatic chuck 6. The top surface of the electrostatic chuck 6 on which the semiconductor wafer W is placed is divided into a plurality of division regions 60. Each of the division regions 60 corresponds to each region obtained when the top surface of the electrostatic chuck 6 is concentrically divided into a plurality of regions, and each of concentric regions excluding the central region is further divided into a plurality of regions in the circumferential direction.

In the present exemplary embodiment, the top surface of the electrostatic chuck 6 is concentrically divided into, for example, five regions as illustrated in FIG. 3. Among the five concentric regions, the second region from the center is divided into, for example, three regions in the circumferential direction as illustrated in FIG. 3. The third region from the center is divided into, for example, six regions in the circumferential direction as illustrated in FIG. 3. The fourth region from the center is divided into, for example, nine regions in the circumferential direction as illustrated in FIG. 3. The outermost region is divided into, for example, eight regions in the circumferential direction as illustrated in FIG. 3. As described above, in the present exemplary embodiment, the top surface of the electrostatic chuck 6 is divided into 27 division regions 60. A method of dividing the top surface of the electrostatic chuck 6 is not limited to the example illustrated in FIG. 3.

One heater 6c is provided corresponding to each of the division regions 60 within the electrostatic chuck 6. An electric power to be supplied to the heater 6c provided in each of the division regions 60 is independently controlled by the control device 200. One heater (not illustrated) is also provided along the shape of the focus ring 5 within the focus ring 5, and an electric power to be supplied to the heater is controlled by the control device 200. The control device 200 independently controls the electric power to be supplied to each of the 27 heaters 6c provided in each of the division regions 60 of the electrostatic chuck 6, and the electric power to be supplied to one heater provided in the focus ring 5.

[Configuration of Control Device 200]

Figure 4:
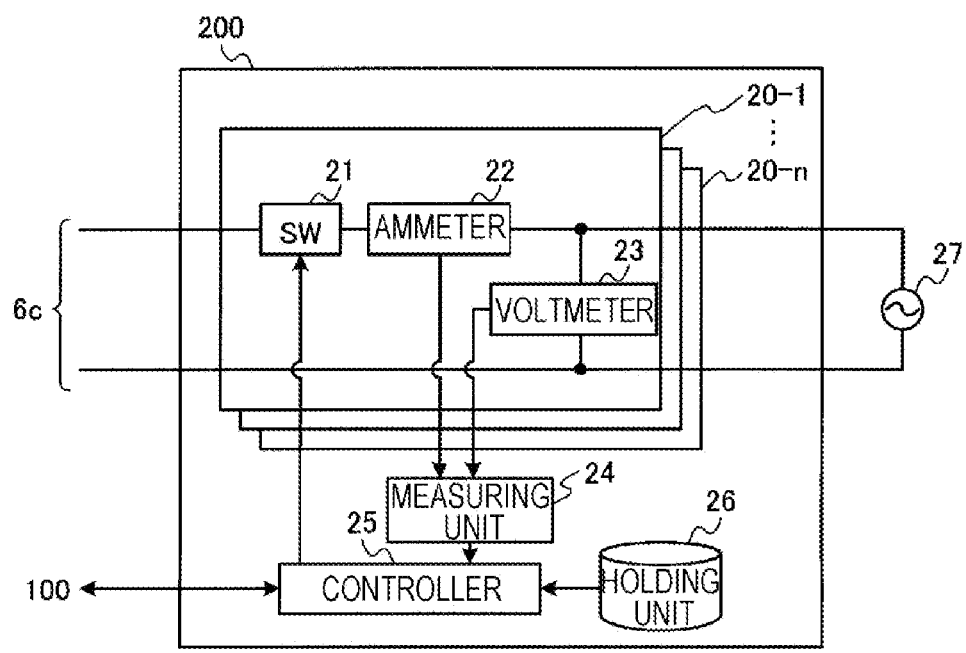
FIG. 4 is a block diagram illustrating an example of a configuration of a control device.

FIG. 4 is a block diagram illustrating an example of the control device 200. As illustrated in FIG. 4, the control device 200 includes, for example, a plurality of power supply units 20-1 to 20-n, a measuring unit 24, a controller 25, and a holding unit 26. Hereinafter, when the plurality of power supply units 20-1 to 20-n are not distinguished from each other but are generically named, the power supply units 20-1 to 20-n are simply referred to as power supply units 20.

One power supply unit 20 is provided in each of the heaters 6c provided in each of the division regions 60 of the electrostatic chuck 6, and supplies an electric power to the corresponding heater 6c. In the present exemplary embodiment, 28 heaters 6c are provided within the substrate processing apparatus 100, and 28 power supply units 20 are provided corresponding to the heaters 6c, respectively. Each of the power supply units 20 includes a switch (SW) 21, an ammeter 22, and a voltmeter 23.

The SW 21 is switched ON/OFF according to the control from the controller 25, and supplies an electric power supplied from a power supply 27 to the corresponding heater 6c during the ON period. The ammeter 22 measures an instantaneous value of an AC current supplied to the corresponding heater 6c from the power supply 27, and outputs the measured instantaneous value to the measuring unit 24. The voltmeter 23 measures an instantaneous value of an AC voltage supplied to the corresponding heater 6c from the power supply 27, and outputs the measured instantaneous value to the measuring unit 24.

Figure 5:
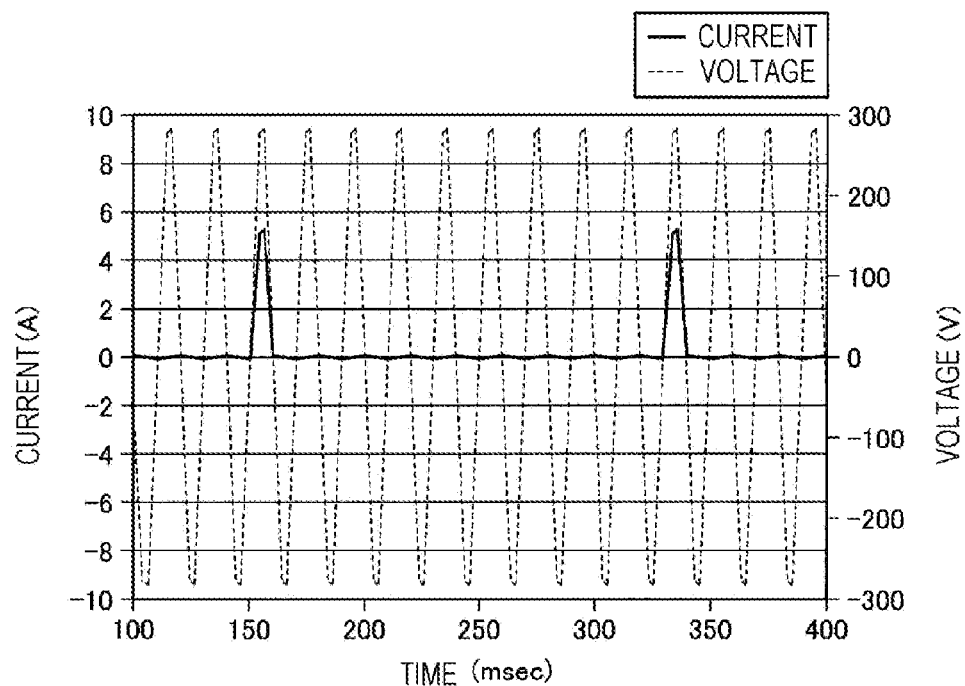
FIG. 5 is a view illustrating exemplary waveforms of an AC voltage and an AC current supplied to each heater.

The measuring unit 24 measures a resistance value of each heater 6c based on the measured voltage and current values of the heater 6c which are output from each power supply unit 20. Then, the measuring unit 24 outputs the measured resistance value of each heater 6c to the controller 25. For example, as illustrated in FIG. 5, an AC voltage at a predetermined frequency (e.g., 50 Hz) is output from the power supply 27, and at a timing when the SW 21 is switched on, a voltage and a current are supplied to the heater 6c. FIG. 5 is a view illustrating exemplary waveforms of an AC voltage and an AC current supplied to each heater 6c.

Figure 6:
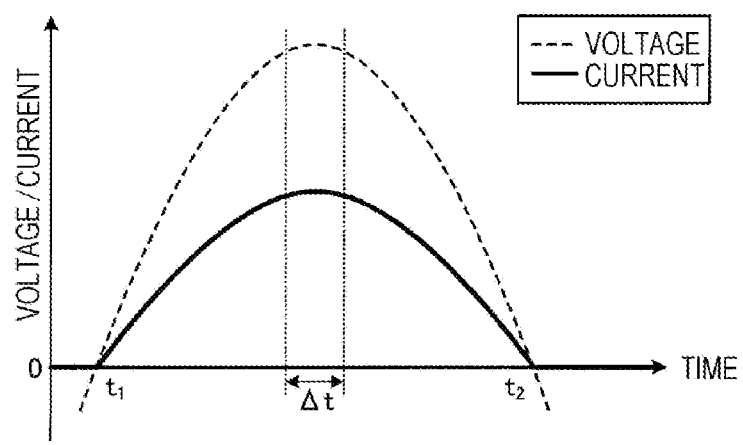
FIG. 6 is a view illustrating an exemplary timing when a resistance value of each heater is measured.

The measuring unit 24 measures a resistance value of each heater 6c based on instantaneous values of an AC voltage and an AC current in the middle between adjacent zero-cross points in each heater 6c. The zero-cross points are, for example, timings $t_1$ and $t_2$ at which the instantaneous value of the AC voltage becomes 0 V as illustrated in FIG. 6. Specifically, the measuring unit 24 measures, for example, a ratio of instantaneous values of the AC voltage and the AC current measured in the period $\Delta t$ that is an intermediate timing between the adjacent zero-cross points $t_1$ and $t_2$, as a resistance value of each heater 6c, as illustrated in FIG. 6.

Here, since, for example, various manufacturing apparatuses or conveying apparatuses are operating in a factory where semiconductors are manufactured, various noises are included in a power supply used in the factory. Thus, when an electric power is supplied to the heaters 6c using the power supply within the factory, variations occur in the measured voltage and current values due to the influence of noises. Therefore, the measuring unit 24 according to the present exemplary embodiment measures a resistance value of each of the heaters 6c from, for example, a ratio of instantaneous values of the AC voltage and the AC current measured in an intermediate timing between the adjacent zero-cross points, as illustrated in FIG. 6. Accordingly, it is possible to suppress variations in the measured voltage and current values due to the influence of noises, and to measure the resistance value of each of the heaters 6c with higher accuracy.

The measuring unit 24 may further reduce the influence of noises by measuring a resistance value of each of the heaters 6c a plurality of times and averaging the measured resistance values. When a three-phase AC power supply used in the factory is used as an electric power to be supplied to each of the heaters 6c, variations of measured resistance values increase due to the influence of different noises included in each phase. Thus, it is desirable to supply an AC voltage and an AC current from a single-phase AC power supply to each of the heaters 6c.

The holding unit 26 holds, for example, a conversion table 260 as illustrated in FIG. 7. FIG. 7 is a view illustrating an example of the conversion table 260. As illustrated in FIG. 7, for example, individual tables 262 are stored in the conversion table 260, for region IDs 261 used for identifying the division regions 60 provided with the heaters 6c, respectively. Resistance values 264 of each of the heaters 6c are stored in association with temperatures 263 in each of the individual tables 262. The holding unit 26 holds a recipe indicating a processing of the semiconductor wafer W. The recipe includes target temperature information of each of the division regions 60 in each step. For example, the conversion table 260 and the recipe are created in advance by, for example, an administrator of the substrate processing system 10 and stored in the holding unit 26.

The controller 25 controls each unit of the substrate processing apparatus 100 based on the recipe held within the holding unit 26. The controller 25 controls the electric power to be supplied to each of the heaters 6c provided in each of the division regions 60 of the electrostatic chuck 6 in each step of the processing so that the temperature of each of the division regions 60 is controlled to be a target temperature indicated by the recipe.

Specifically, the controller 25 reads the target temperature information and the conversion table 260 of each division region 60 from the holding unit 26 in each step of the processing. The controller 25 always acquires a resistance value of each heater 6c measured by the measuring unit 24. Then, the controller 25, with reference to the conversion table 260 for each division region 60 of the electrostatic chuck 6, estimates a temperature corresponding to the resistance value of the heater 6c provided in the division region 60 as a temperature of the division region 60. Then, the controller 25 controls the ratio of switching ON/OFF of the SW 21 within the power supply unit 20 according to a difference between the estimated temperature and a target temperature for each division region 60, thereby controlling an electric power to be supplied to the heater 6c.

Here, when a temperature sensor is provided within the base unit 2a for each of the division regions 60 of the electrostatic chuck 6 to measure the temperature of each of the division regions 60, a space in which the temperature sensor is to be arranged is required in the base unit 2a. The electrostatic chuck 6 may be divided into more division regions 60 in order to more precisely control the temperature distribution of the electrostatic chuck 6. Thus, more temperature sensors may be arranged in the base unit 2a according to the number of the division regions 60. As the number of the temperature sensors arranged in the base unit 2a increases, it becomes difficult to miniaturize the base unit 2a. When the number of temperature sensors arranged in the base unit 2a are increased, the structure of the base unit 2a becomes complicated, and the degree of freedom in design is decreased.

In contrast, in the substrate processing system 10 according to the present exemplary embodiment, the temperature of each of the division regions 60 is estimated based on the resistance value of each of the heaters 6c provided in each of the division regions 60 within the electrostatic chuck 6. Accordingly, it becomes not necessary to arrange temperature sensors in the base unit 2a, and it becomes possible to miniaturize the base unit 2a. Since temperature sensors arranged in the base unit 2a may be eliminated or reduced, the structure of the base unit 2a may be simplified, and the degree of freedom in design is also improved.

[Operation of Control Device 200]

Figure 8:
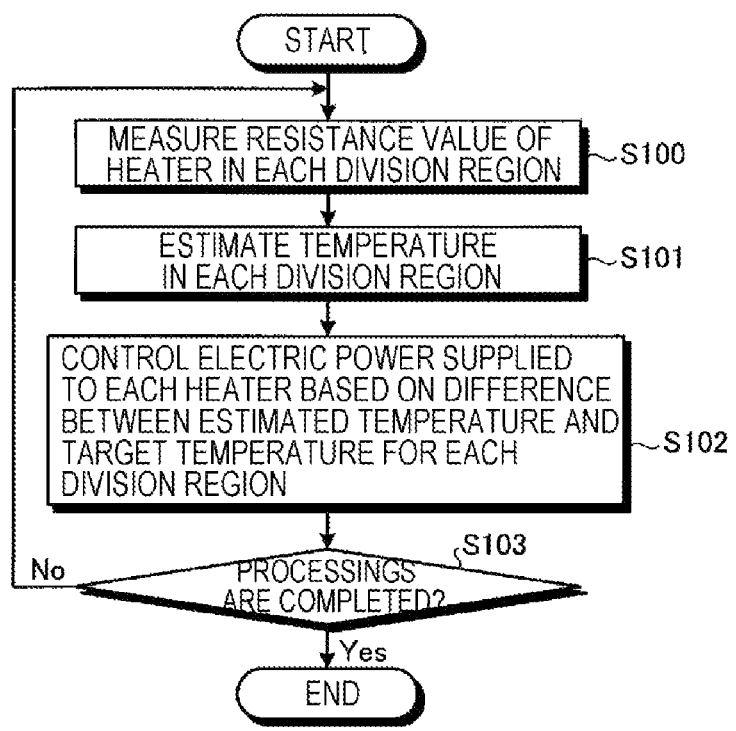
FIG. 8 is a flow chart illustrating an example of an operation of the control device in the first exemplary embodiment.

FIG. 8 is a flow chart illustrating an example of an operation of the control device 200 in the first exemplary embodiment. For example, the control device 200 starts a temperature control process illustrated in the flow chart when the process based on the recipe is initiated. Information such as the conversion table 260 and the recipe is stored in advance in the holding unit 26.

First, the controller 25 controls the SW 21 within each power supply unit 20 to start to supply an electric power to each heater 6c. Then, the measuring unit 24 measures a resistance value of the heater 6c in each division region 60 based on an instantaneous value of an AC current measured by each ammeter 22 and an instantaneous value of an AC voltage measured by each voltmeter 23 in the middle period between adjacent zero-cross points of the AC voltage (S100). The measuring unit 24 obtains an average of resistance values through a plurality of measurements during a predetermined period (e.g., several seconds) for each heater 6c, and outputs the average resistance value to the controller 25.

Thereafter, the controller 25, with reference to the conversion table 260 in the holding unit 26 for each division region 60, estimates a temperature corresponding to the resistance value of the heater 6c provided in the division region 60, as a temperature of the division region 60 (S101). Then, the controller 25 controls the ratio of switching ON/OFF of the SW 21 within the power supply unit 20 according to a difference between the estimated temperature and a target temperature for each division region 60, thereby controlling an electric power to be supplied to the heater 6c (S102).

Subsequently, the controller 25 determines whether the processings are completed with reference to the recipe (S103). When it is determined that the processings are not completed (S103: No), the measuring unit 24 executes the processing described in step S100 again. Meanwhile, when it is determined that the processings are completed (S103: Yes), the control device 200 ends the temperature control process illustrated in the flow chart.

As described above, the substrate processing system 10 according to the present exemplary embodiment includes the substrate processing apparatus 100 and the control device 200. The substrate processing apparatus 100 includes the chamber 1, the electrostatic chuck 6 provided within the chamber 1, on which the semiconductor wafer W is placed, and the heaters 6c embedded in the electrostatic chuck 6 corresponding to division regions 60, respectively, that is, a plurality of divided regions of the top surface of the electrostatic chuck 6. The control device 200 includes: the holding unit 26 that holds the conversion table 260 for each of the division regions 60, the conversion table 260 indicating a relationship between a resistance value of each of the heaters 6c embedded in the electrostatic chuck 6 and a temperature of each of the division regions 60; the measuring unit 24 that measures the resistance value of each heater 6c embedded in the electrostatic chuck 6 for each division region 60; and the controller 25 that estimates a temperature of the division region 60 corresponding to the resistance value of the heater 6c measured by the measuring unit 24 with reference to the conversion table 260 for each division region 60, and controls an electric power to be supplied to the heater 6c so that the estimated temperature becomes a target temperature. Accordingly, it becomes possible to miniaturize the electrostatic chuck 6 and the base unit 2a and to simplify the structure thereof.

In the present exemplary embodiment, an AC voltage and an AC current are supplied to each heater 6c, and the measuring unit 24 measures the resistance value of each heater 6c based on instantaneous values of the AC voltage and the AC current at an intermediate timing between adjacent zero-cross points at which the instantaneous value of the AC voltage supplied to each heater 6c becomes 0 V. Accordingly, even when a power supply in a factory with many noises is used, the measuring unit 24 may suppress the measurement accuracy of the resistance value of each heater 6c from being lowered.

Second Exemplary Embodiment

In the above described first exemplary embodiment, since the temperature of each of the division regions 60 is estimated based on the resistance value of each of the heaters 6c provided in each of the division regions 60 within the electrostatic chuck 6, a temperature sensor for measuring the temperature of the division regions 60 is not provided. Meanwhile, in the present exemplary embodiment, a temperature sensor is provided in one among the plurality of division regions 60. Temperatures estimated for the division regions 60 are corrected based on a difference between a temperature estimated from the resistance value of the heater 6c in the division region 60 provided with the temperature sensor, and a temperature measured by the temperature sensor.

[Configuration of Substrate Processing Apparatus 100]

Figure 9:
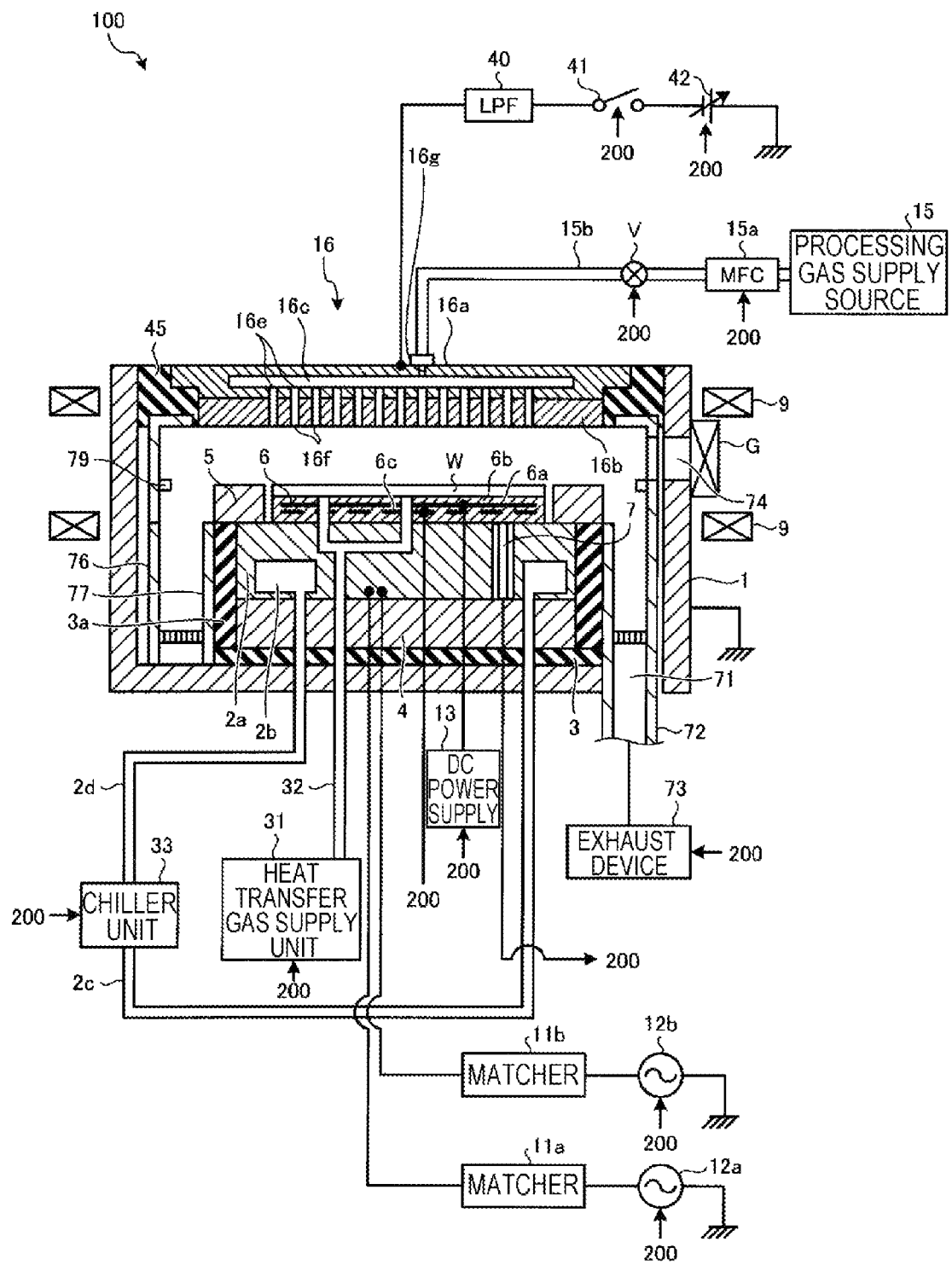
FIG. 9 is a sectional view illustrating an example of a configuration of a substrate processing apparatus according to a second exemplary embodiment.

FIG. 9 is a sectional view illustrating an example of a configuration of the substrate processing apparatus 100 according to the second exemplary embodiment. In FIG. 9, members denoted by the same reference numerals as those in FIG. 2 have the same or similar functions as the members illustrated in FIG. 2 except for the points described below, and thus descriptions thereof will be omitted.

In the present exemplary embodiment, one temperature sensor 7 is provided in one division region 60 among the plurality of division regions 60 within the electrostatic chuck 6, within the base unit 2a below the division region 60, to measure the temperature of the division region 60. The temperature sensor 7 is, for example, a fluorescent optical fiber thermometer. The temperature sensor 7 measures the temperature of one division region 60 from the rear surface of the electrostatic chuck 6, and outputs the measured temperature to the control device 200. In the present exemplary embodiment, the temperature sensor 7 measures the temperature of one division region 60 among six division regions 60 included in the third concentric region from the center.

[Operation of Control Device 200]

Figure 10:
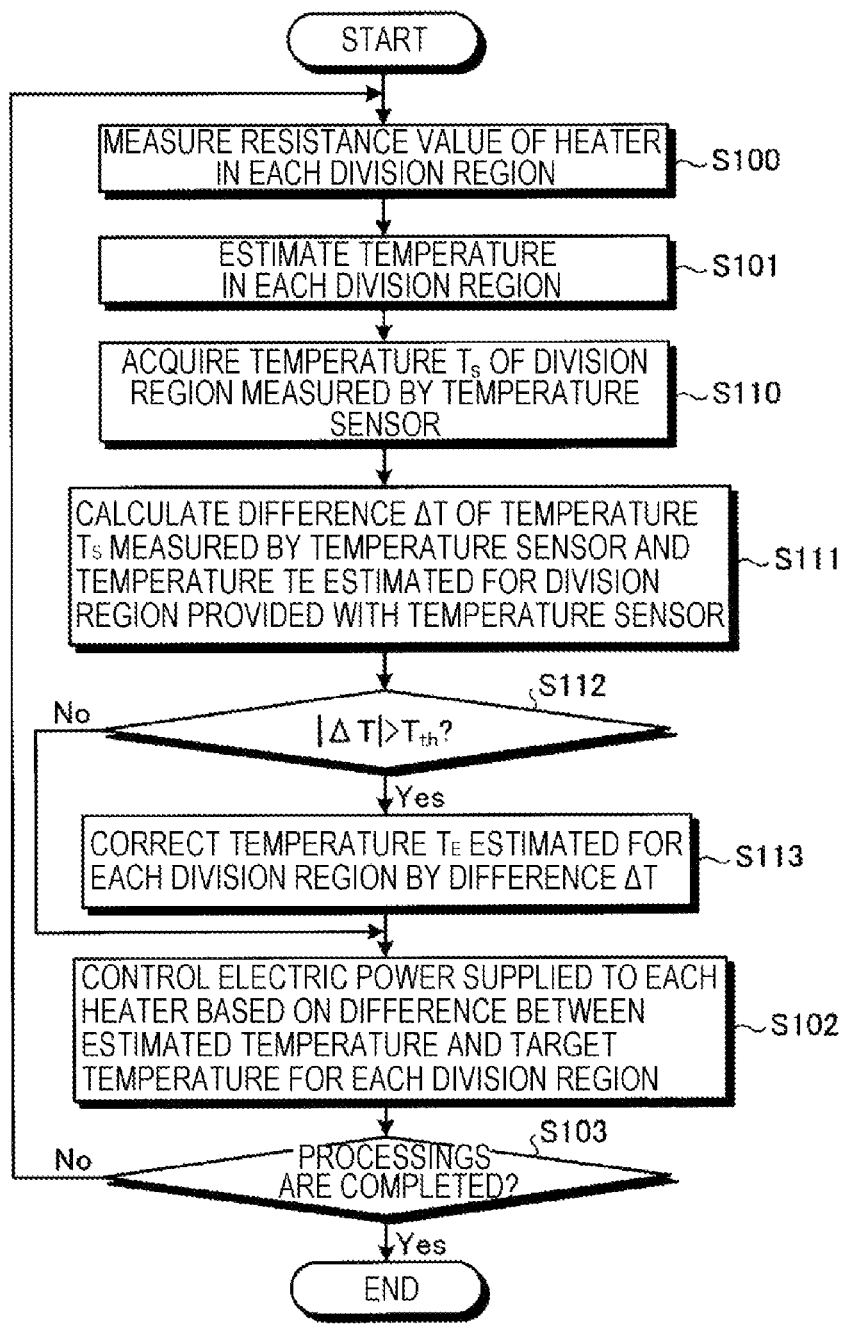
FIG. 10 is a flow chart illustrating an example of an operation of a control device in the second exemplary embodiment.

FIG. 10 is a flow chart illustrating an example of an operation of the control device 200 in the second exemplary embodiment. In FIG. 10, processings denoted by the same reference numerals as those in FIG. 8 are the same processings as those illustrated in FIG. 8 except for the points described below, and thus descriptions thereof will be omitted.

The controller 25 estimates the temperature of each of the division regions 60 of the electrostatic chuck 6 (S101), and acquires information on a temperature $T_s$ of a division region 60 measured by the temperature sensor 7, from the temperature sensor 7 (S110). In step S110, the controller 25 uses an average of temperatures of the division region 60 obtained through a plurality of measurements by the temperature sensor 7 during a predetermined period (e.g., several seconds), as the temperature $T_s$ of the division region 60 measured by the temperature sensor 7. Then, the controller 25 calculates a difference $\Delta T$ of the temperature $T_s$ of the division region 60 measured by the temperature sensor 7 and a temperature $T_e$ estimated for the division region 60 provided with the temperature sensor 7 by the following calculation equation (1) (S111).

$$\Delta T = T_e - T_s \qquad (1)$$

For example, when the temperature $T_e$ estimated for the division region 60 provided with the temperature sensor 7 is 18° C., and the temperature $T_s$ of the division region 60 measured by the temperature sensor 7 is 20° C., the difference $\Delta T$ becomes −2° C. (=18−20).

Thereafter, the controller 25 determines whether the absolute value of the difference $\Delta T$ is larger than a predetermined threshold value $T_{th}$ (S112). The threshold value $T_{th}$ is, for example, 0.2° C. When it is determined that the absolute value of the difference $\Delta T$ is not larger than the threshold value $T_{th}$ (S112: No), the controller 25 executes the processing described in S102.

Meanwhile, when it is determined that the absolute value of the difference $\Delta T$ is larger than the threshold value $T_{th}$ (S112: Yes), the controller 25 corrects the temperature $T_e$ estimated for each of the division regions 60 by the difference $\Delta T$ (S113). Specifically, the controller 25 adds the difference $\Delta T$ to the temperature $T_e$ estimated for each division region 60, thereby correcting the temperature $T_e$ estimated for each division region 60. For example, when the difference $\Delta T$ is −2° C., and the temperature $T_e$ estimated for a certain division region 60 is 20° C., the controller 25 corrects the temperature $T_e$ estimated for the division region 60 to 18° C. (=20+(−2)).

[Experimental Result]

FIGS. 11A to 11D are views for explaining an effect of correction by the temperature sensor 7. In the experimental results illustrated in FIGS. 11A to 11D, a substrate processing apparatus 100 is used in which a first temperature sensor 7 is provided in a first division region 60, and a second temperature sensor 7 is provided in a second division region 60 different from the first division region 60. In the experimental results illustrated in FIGS. 11A to 11D, the first division region 60 is one division region 60 included in the third region from the center side among concentric regions, and the second division region 60 is one division region 60 included in the fourth region from the center side among concentric regions. The second temperature sensor 7 is provided only for this experiment. In FIGS. 11A to 11D, the temperature of each of the division regions 60 is controlled to be 30° C. The temperature of the refrigerant is 10° C.

Figure 11A:
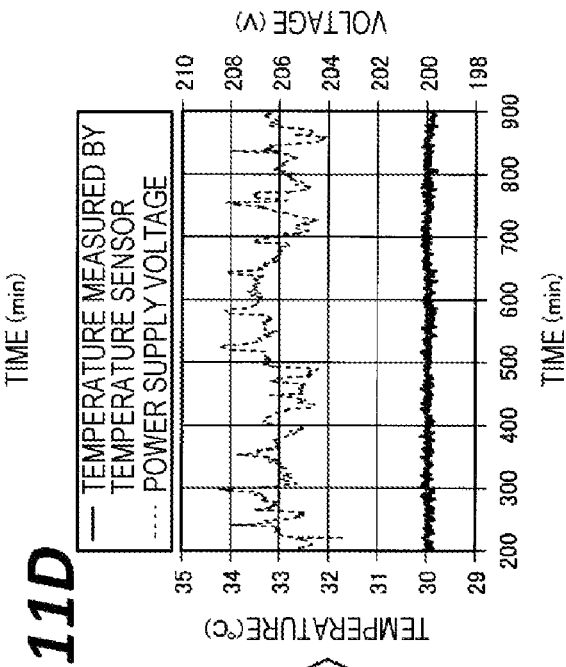
FIGS. 11A to 11D are views for explaining an effect of correction by a temperature sensor.
Figure 11B:
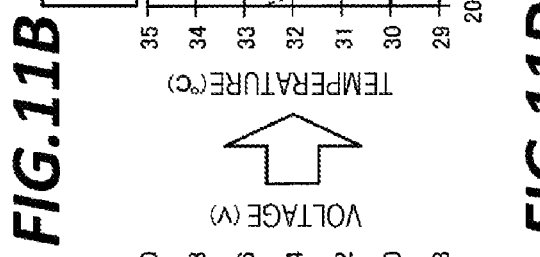

FIG. 11A illustrates the temperature of the first division region 60 and the effective value of the AC voltage supplied to the heater 6c provided in the division region 60 in a case where correction by the first temperature sensor 7 is not performed. FIG. 11B illustrates the temperature of the first division region 60 and the effective value of the AC voltage supplied to the heater 6c provided in the division region 60 in a case where correction by the first temperature sensor 7 is performed. The temperature of the first division region 60 is measured by the first temperature sensor 7.

In the experimental result of FIG. 11A, the temperature variation of the first division region 60 falls within a range of 0.53° C., and 3σ indicating the temperature variation distribution is 0.34° C. In the experimental result of FIG. 11B, the temperature variation of the first division region 60 falls within a range of 0.09° C., and 3σ indicating the temperature variation distribution is 0.03° C. σ represents a standard deviation of the temperature variation distribution.

Figure 11C:
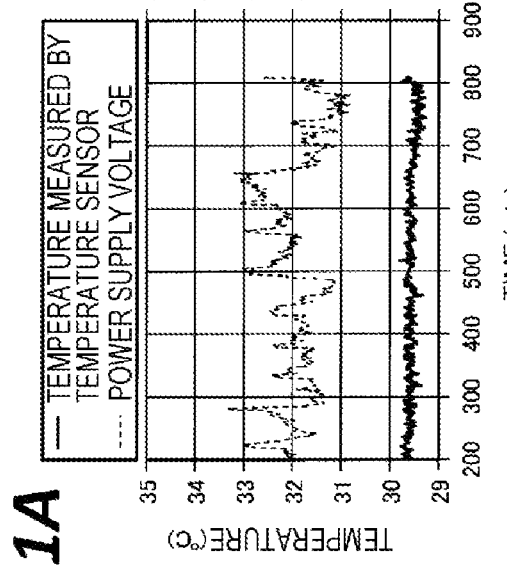
Figure 11D:
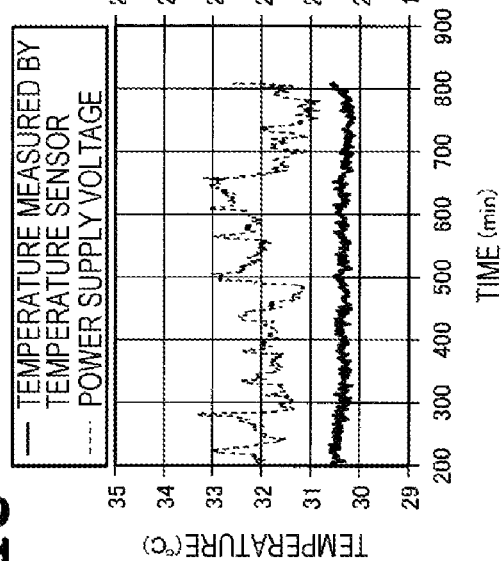

FIG. 11C illustrates the temperature of the second division region 60 and the effective value of the AC voltage supplied to the heater 6c provided in the division region 60 in a case where correction by the first temperature sensor 7 is not performed. FIG. 11D illustrates the temperature of the second division region 60 and the effective value of the AC voltage supplied to the heater 6c provided in the division region 60 in a case where correction by the first temperature sensor 7 is performed. The temperature of the second division region 60 is measured by the second temperature sensor 7.

In the experimental result of FIG. 11C, the temperature variation of the second division region 60 falls within a range of 0.51° C., and 3σ indicating the temperature variation distribution is 0.36° C. In the experimental result of FIG. 11D, the temperature variation of the second division region 60 falls within a range of 0.33° C., and 3σ indicating the temperature variation distribution is 0.26° C.

Referring to experimental results of FIGS. 11A and 11C, even when the correction by the first temperature sensor 7 is not performed, the temperature variation range of the division region 60 is suppressed to be less than 1° C. Referring to experimental results of FIGS. 11B and 11D, when the correction by the first temperature sensor 7 is performed, the temperature variation range of the division region 60 is further suppressed to be less than 0.5° C.

As described above, in the substrate processing system 10 according to the present exemplary embodiment, the temperature sensor 7 is provided within the base unit 2a corresponding to at least one division region 60. When a difference equal to or larger than a predetermined value occurs between a temperature of the division region 60 measured by the temperature sensor 7 and a temperature estimated based on a resistance value of the heater 6c provided in the division region 60, the controller 25 corrects temperatures estimated for all division regions 60 based on the difference. Accordingly, it is possible to control the temperature of each of the division regions 60 with higher accuracy.

Third Exemplary Embodiment

In the above described first and second exemplary embodiments, the conversion table 260 was created in advance and stored in the holding unit 26. Meanwhile, in the substrate processing system 10 according to the present exemplary embodiment, creation of the conversion table 260 is performed.

Figure 12:
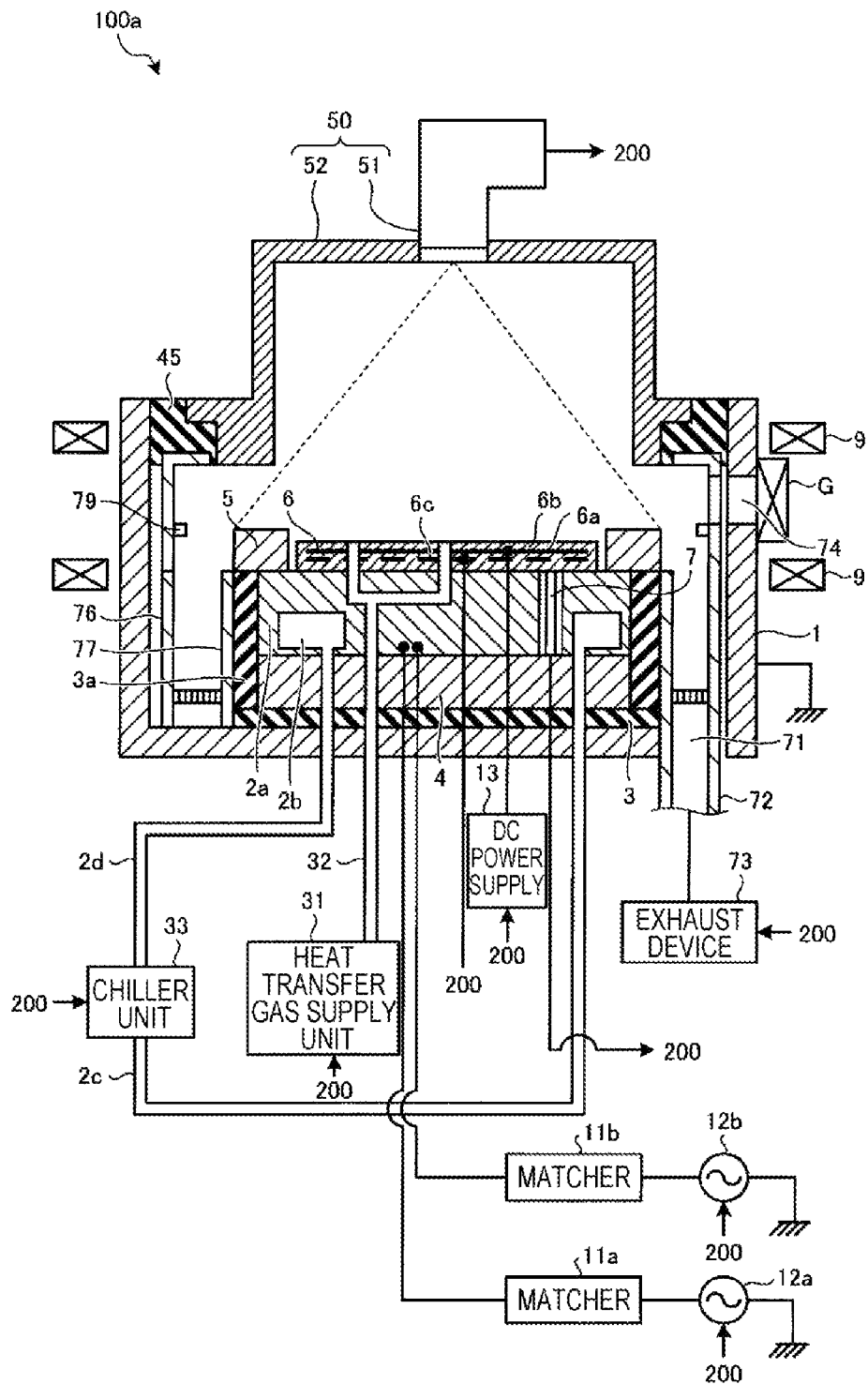
FIG. 12 is a sectional view illustrating an example of a configuration of a substrate processing apparatus when a conversion table is created.

FIG. 12 is a sectional view illustrating an example of a configuration of a substrate processing apparatus 100a when a conversion table 260 is created. For example, as illustrated in FIG. 12, when the conversion table 260 is created, the shower head 16 described with reference to FIG. 2 or FIG. 9 is removed from the chamber 1, and, for example, a calibration unit 50 illustrated in FIG. 12 is attached to the chamber 1. In FIG. 12, members denoted by the same reference numerals as those in FIG. 2 or FIG. 9 have the same or similar functions as the members illustrated in FIG. 2 or FIG. 9 except for the points described below, and thus descriptions thereof will be omitted.

The calibration unit 50 includes an infrared (IR) camera 51 and a cover member 52. The cover member 52 supports the IR camera 51 such that the shooting direction of the IR camera 51 faces the direction of the electrostatic chuck 6. The IR camera 51 measures a radiation amount distribution of light with a predetermined wavelength (infrared light in the present exemplary embodiment) emitted from the top surface of the electrostatic chuck 6. Then, the IR camera 51 outputs information indicating the measured radiation amount distribution of the infrared light to the control device 200.

[Creation Process of Conversion Table 260]

Figure 13:
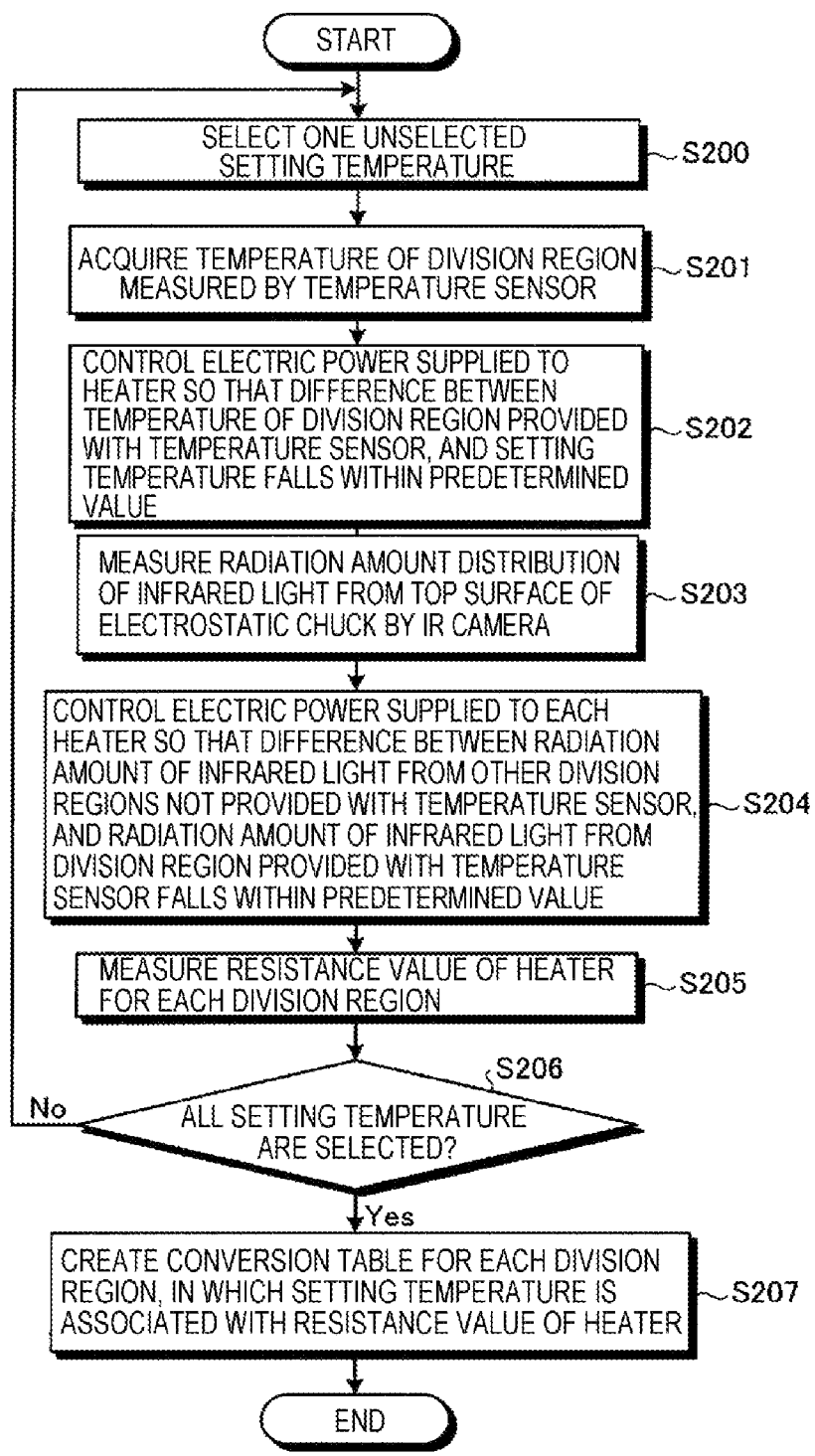
FIG. 13 is a flow chart illustrating an example of an operation of a control device in a third exemplary embodiment.

FIG. 13 is a flow chart illustrating an example of an operation of the control device 200 in the third exemplary embodiment. For example, the control device 200 starts a creation process of the conversion table 260 illustrated in the flow chart when an instruction to create the conversion table 260 is received from, for example, an administrator of the substrate processing system 10. Information of each setting temperature set in the conversion table 260 has been stored in advance in the holding unit 26 by, for example, the administrator of the substrate processing system 10.

First, the controller 25 selects one of unselected setting temperatures with reference to the holding unit 26 (S200). In the present exemplary embodiment, 11 setting temperatures have been stored in advance in the conversion table 260 in the holding unit 26, at intervals of, for example, 10° C. from 20° C. to 120° C.

Thereafter, the controller 25 acquires a temperature of the division region 60 measured by the temperature sensor 7 (S201). Then, the controller 25 controls an electric power to be supplied to the heater 6c of the division region 60 provided with the temperature sensor 7 so that a difference between the temperature of the division region 60 provided with the temperature sensor 7, and the setting temperature selected in step S200 falls within a predetermined value (e.g., within ±0.5° C.) (S202). In step S202, the controller 25 controls the SW 21 in each power supply unit 20 so that the same amount of power may be supplied to each of the heaters 6c in each of the division regions 60, other than the division region 60 provided with the temperature sensor 7. The controller 25 controls the chiller unit 33 according to the setting temperature and adjusts the temperature of the refrigerant circulated within the base unit 2a.

After a difference between the temperature of the division region 60 provided with the temperature sensor 7, and the setting temperature selected in step S200 falls within a predetermined value, the IR camera 51 measures a radiation amount distribution of infrared light emitted from the top surface of the electrostatic chuck 6 (S203). Then, the IR camera 51 outputs information indicating the radiation amount distribution of the infrared light to the control device 200. The controller 25 obtains an average radiation amount in each of the division regions 60 using information on the radiation amount distribution of infrared light output from the IR camera 51 to calculate a radiation amount of infrared light in each of the division regions 60.

Subsequently, the controller 25 controls the electric power to be supplied to each of the heaters 6c so that a difference between the radiation amount of infrared light from other division regions 60 not provided with the temperature sensor 7, and the radiation amount of infrared light from the division region 60 provided with the temperature sensor 7 falls within a predetermined value (S204). The predetermined value is a value at which a temperature difference becomes, for example, 0.2° C. when the difference between infrared light radiation amounts is converted into a temperature difference.

After the difference between the radiation amount of infrared light from other division regions 60 not provided with the temperature sensor 7, and the radiation amount of infrared light from the division region 60 provided with the temperature sensor 7 falls within a predetermined value, the measuring unit 24 measures a resistance value of each of the heaters 6c for each of the division regions 60 based on an instantaneous value of the AC current measured by each ammeter 22 and an instantaneous value of the AC voltage measured by each voltmeter 23 in an intermediate timing between the adjacent zero-cross points of the AC voltage (S205). Then, the controller 25 holds the setting temperature selected in step S200, for each of the division regions 60, in association with the resistance value of each of the heaters 6c provided in each of the division regions 60.

Thereafter, the controller 25 determines whether all setting temperature have been selected with reference to the holding unit 26 (S206). When it is determined that there is an unselected setting temperature (S206: No), the controller 25 executes the processing described in step S200 again.

Meanwhile, when it is determined that all setting temperatures have been selected (S206: Yes), the controller 25 creates the conversion table 260 for each of the division regions 60, in which a setting temperature is associated with a resistance value of each of the heaters 6c (S207). Then, the control device 200 ends the creation process of the conversion table 260 illustrated in the flow chart.

[Hardware]

Figure 14:
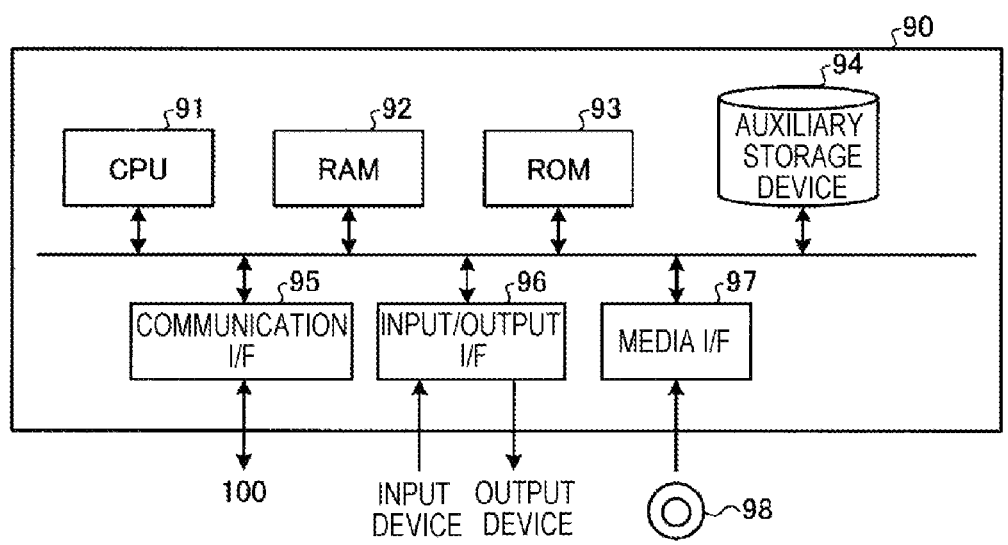
FIG. 14 is a view illustrating an example of a computer that implements functions of the control device.

The control device 200 in the above described first to third exemplary embodiments is implemented using, for example, a computer 90 configured as illustrated in FIG. 14. FIG. 14 is a view illustrating an example of the computer 90 that implements functions of the control device 200. The computer 90 includes, a central processing unit (CPU) 91, a random access memory (RAM) 92, a read only memory (ROM) 93, an auxiliary storage device 94, a communication interface (I/F) 95, an input/output interface (I/F) 96, and a media interface (I/F) 97.

The CPU 91 operates based on a program stored in the ROM 93 or the auxiliary storage device 94 to control respective units. The ROM 93 stores, for example, a boot program executed by the CPU 91 when the computer 90 is activated or a program dependent on hardware of the computer 90.

The auxiliary storage device 94 is, for example, a hard disk drive (HDD) or a solid state drive (SSD), and stores, for example, a program executed by the CPU 91 and data used by the program. The CPU 91 reads the program from the auxiliary storage device 94, loads the read program on the RAM 92, and executes the loaded program.

The communication I/F 95 communicates with the substrate processing apparatus 100 through a communication line such as a local area network (LAN). The communication I/F 95 receives data from the substrate processing apparatus 100 through the communication line and sends the data to the CPU 91, and transmits the data generated by the CPU 91 to the substrate processing apparatus 100 through the communication line.

The CPU 91 controls an input device such as a keyboard, and an output device such as a display through the I/O I/F 96. The CPU 91 acquires signals input from the input device through the I/O I/F 96 and sends the acquired signals to the CPU 91. The CPU 91 outputs the generated data to the output device through the I/O I/F 96.

The media I/F 97 reads a program or data stored in a recording medium 98, and stores the read program or data in the auxiliary storage device 94. The recording medium 98 is, for example, an optical recording medium such as a digital versatile disc (DVD) or a phase change rewritable disk (PD), a magneto-optical recording medium such as a magneto-optical (MO) disk, a tape medium, a magnetic recording medium, or a semiconductor memory.

The CPU 91 of the computer 90 executes a program loaded on the RAM 92 to implement respective functions of the power supply unit 20, the measuring unit 24, and the controller 25. The auxiliary storage device 94 stores data within the holding unit 26.

The CPU 91 of the computer 90 reads the program to be loaded on the RAM 92, from the recording medium 98 and stores the read program in the auxiliary storage device 94. In another example, the CPU 91 may acquire the program from another device through a communication line, and store the acquired program in the auxiliary storage device 94.

The disclosed technology is not limited to the above described exemplary embodiments, and various modifications may be made within the scope of the gist thereof.

For example, in the above described first exemplary embodiment, a resistance value of each of the heaters 6c is measured based on instantaneous values of the AC voltage and the AC current in an intermediate timing between the adjacent zero-cross points at which the instantaneous value of the AC voltage supplied to each of the heaters 6c becomes 0 V. However, the voltage to be supplied to the heaters 6c is not limited to the AC voltage. For example, a DC voltage and a DC current may be supplied to the heaters 6c. In this case, the resistance value of each of the heaters 6c may be obtained from the DC voltage and the DC current supplied to each of the heaters 6c.

In the above described third exemplary embodiment, in the substrate processing apparatus 100a used for manufacturing a semiconductor wafer W, the shower head 16 is removed from the chamber 1, and the calibration unit 50 is attached to the top portion of the chamber 1. However, the disclosed technology is not limited thereto. For example, in a manufacturer for manufacturing the electrostatic chuck 6 and the base unit 2a, the substrate processing apparatus 100a may be used as a jig for creating the conversion table 260. In this case, when the conversion table 260 is created, unnecessary functions (for example, the ring magnet 9, the matchers 11a, and 11b, the high-frequency power supplies 12a and 12b, the DC power supply 13, and the heat transfer gas supply unit 31) may not be provided in the substrate processing apparatus 100a.

In the above described second and third exemplary embodiments, one temperature sensor 7 is provided in the base unit 2a, but the disclosed technology is not limited thereto. As long as the number of the temperature sensors 7 is smaller than the number of the division regions 60, two or more temperature sensors 7 may be provided in the base unit 2a. Even when two or more temperature sensors 7 are provided, the electrostatic chuck 6 and the base unit 2a may be miniaturized and the structures thereof may be simplified as compared to a case where temperature sensors 7 are provided in all division regions 60, respectively.

In the above described second exemplary embodiment, when a difference equal to or larger than a predetermined value occurs between a temperature $T_e$ estimated from a resistance value of the heater 6c in the division region 60 provided with the temperature sensor 7 and a temperature $T_s$ measured by the temperature sensor 7, temperatures $T_e$ estimated for respective division regions 60 are corrected based on the difference between the temperature $T_e$ and the temperature $T_s$. However, the disclosed technology is not limited thereto. For example, temperatures $T_e$ estimated for respective division regions 60 may be corrected based on the difference between the temperature $T_e$ and the temperature $T_s$ irrespective of the magnitude of the difference between the temperature $T_e$ and the temperature $T_s$.

In the above described second and third exemplary embodiments, a fluorescent optical fiber thermometer is exemplified as the temperature sensor 7, but the disclosed technology is not limited thereto. As long as the temperature sensor 7 is a sensor capable of measuring a temperature, the temperature sensor 7 may be, for example, a thermocouple.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system comprising:
    a substrate processing apparatus including
        a chamber,
        a substrate support disposed in the chamber, the substrate support including a base and an electrostatic chuck disposed on the base, the electrostatic chuck having a plurality of division regions each division region including a heater, and
        a temperature sensor disposed in the base, and configured to measure a temperature of a first division region among the plurality of division regions; and
    a controller including
        a measuring circuit configured to measure a resistance value of the heater for each of the plurality of division regions,
        an estimating circuit configured to estimate a temperature of each of the plurality of division regions based on the resistance value of the heater measured by the measuring circuit, and a relationship between resistance values of the heater and temperatures of the division region,
        a determining circuit configured to determine whether to correct the estimated temperature of each of the plurality of division regions based on the measured temperature and the estimated temperature of the first division region,
        a correcting circuit configured to, when the determining circuit determines to correct the estimated temperature of each of the plurality of division regions, correct the estimated temperature of each of the plurality of division regions based on the measured temperature and the estimated temperature of the first division region, and
        a power controller configured to, when the determining circuit determines to correct the estimated temperature of each of the plurality of division regions, control a power supplied to the heater for each of the plurality of division regions based on the temperature corrected by the correcting circuit, and when the determining circuit determines not to correct the estimated temperature of each of the plurality of division regions, control the power supplied to the heater for each of the plurality of division regions based on the temperature estimated by the estimating circuit.

2. The substrate processing system according to claim 1, wherein the measurement by the measuring circuit, the estimation by the estimating circuit, the determination by the determining circuit, the correction by the correcting circuit, and the control by the power controller are performed while a processing is performed on the substrate.

3. The substrate processing system according to claim 1, wherein the controller further includes a holding circuit configured to hold a table for each of the plurality of division regions and in association with the division region, the table indicating a relationship between the resistance value of the heater provided in the division region and the temperature of the division region, and
    the estimating circuit estimates the temperature of each of the plurality of division regions based on the measured resistance value of the heater provided in the division region, and the table associated with the division region.

4. The substrate processing system according to claim 3, wherein the estimating circuit refers to the table associated with each of the plurality of division regions, and estimates a temperature corresponding to the measured resistance value of the heater provided in the division region, as the temperature of the division region.

5. The substrate processing system according to claim 1, wherein the power controller controls the power supplied to the heater to make the temperature of each of the plurality of division regions reach a target temperature.

6. The substrate processing system according to claim 1, wherein the temperature sensor is a fluorescent optical fiber thermometer.

7. The substrate processing system according to claim 6, wherein the controller further includes a calculating circuit configured to calculate a difference between the measured temperature and the estimated temperature of the first division region, and
    the correcting circuit corrects the estimated temperature of each of the plurality of division regions based on the difference.

8. The substrate processing system according to claim 7, wherein the determining circuit performs the determination by determining whether the difference calculated by the calculating circuit is larger than a threshold value.

9. The substrate processing system according to claim 8, wherein the substrate processing apparatus further includes a power supply configured to supply an AC voltage and an AC current to the heater, and
    the measuring circuit measures the resistance value of the heater based on instantaneous values of the AC voltage and the AC current at an intermediate timing between adjacent zero-cross points at which an instantaneous value of the AC voltage supplied to the heater becomes 0 V.

* * * * *